US012787781B2

(12) United States Patent
Kim et al.

(10) Patent No.: US 12,787,781 B2
(45) Date of Patent: Nov. 3, 2026

(54) SEMICONDUCTOR PACKAGE

(71) Applicant: SAMSUNG ELECTRONICS CO., LTD., Suwon-si (KR)

(72) Inventors: Cheol Kim, Suwon-si (KR); Seokhyun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 549 days.

(21) Appl. No.: 18/237,209

(22) Filed: Aug. 23, 2023

(65) Prior Publication Data

US 2024/0071866 A1 Feb. 29, 2024

(30) Foreign Application Priority Data

Aug. 24, 2022 (KR) ........................ 10-2022-0106352

(51) Int. Cl.

*H10W 40/77* (2026.01)
*H10W 70/60* (2026.01)
(Continued)

(52) U.S. Cl.

CPC ......... *H10W 40/778* (2026.01); *H10W 70/60* (2026.01); *H10W 70/685* (2026.01);
(Continued)

(58) Field of Classification Search

None
See application file for complete search history.

(56) References Cited

U.S. PATENT DOCUMENTS

| | | | |
|---|---|---|---|
| 8,198,541 | B2 | 6/2012 | Sasaoka et al. |
| 8,865,521 | B2 | 10/2014 | Jeng et al. |

(Continued)

FOREIGN PATENT DOCUMENTS

| | | | |
|---|---|---|---|
| KR | 10-2009-0091333 | A | 8/2009 |
| KR | 10-2015-0030023 | A | 3/2015 |
| KR | 10-2022-0043519 | A | 4/2022 |

OTHER PUBLICATIONS

Office Action in Korean Appln. No. 10-2022-0106352, mailed on Mar. 9, 2026, 17 pages (with English translation).

*Primary Examiner* — Xiaoming Liu
(74) *Attorney, Agent, or Firm* — Fish & Richardson P.C.

(57) ABSTRACT

A semiconductor package includes a package substrate, a first semiconductor chip, and an encapsulant surrounding the semiconductor chip. The first semiconductor chip includes a semiconductor substrate having an active surface and an inactive surface opposite to the active surface, the semiconductor chip disposed on the package substrate such that the active surface faces the package substrate. The semiconductor package further includes a first redistribution structure on the encapsulant. The first redistribution structure includes a thermally conductive pattern, a heat-conducting through via providing a path for heat to conduct from the semiconductor substrate to the thermally conductive pattern, and a redistribution insulating layer surrounding the heat-conducting through via. The semiconductor substrate includes a first contact region having a higher temperature than a surrounding area on the inactive surface, and the heat-conducting through via passes through the encapsulant and contacts the first contact region.

20 Claims, 16 Drawing Sheets

12

(51) Int. Cl.

| | |
|---|---|
| ***H10W 70/685*** | (2026.01) |
| ***H10W 74/10*** | (2026.01) |
| ***H10W 90/00*** | (2026.01) |
| *H10W 74/15* | (2026.01) |

(52) U.S. Cl.
CPC .......... *H10W 74/117* (2026.01); *H10W 90/00* (2026.01); *H10W 74/15* (2026.01); *H10W 90/724* (2026.01); *H10W 90/734* (2026.01)

(56) References Cited

U.S. PATENT DOCUMENTS

| | | | | |
|---|---|---|---|---|
| 9,293,437 | B2 | 3/2016 | Yu et al. | |
| 9,735,087 | B2 | 8/2017 | Chang et al. | |
| 9,875,970 | B2 | 1/2018 | Yi et al. | |
| 11,043,441 | B2 | 6/2021 | Lee et al. | |
| 2015/0097277 | A1* | 4/2015 | Chen ................. | H01L 23/49816 257/668 |
| 2017/0309571 | A1* | 10/2017 | Yi ....................... | H01L 23/5384 |
| 2019/0123025 | A1* | 4/2019 | Chen ................... | H01L 25/0657 |
| 2021/0193555 | A1 | 6/2021 | Lee et al. | |
| 2022/0102236 | A1 | 3/2022 | Kim et al. | |
| 2022/0165648 | A1 | 5/2022 | Kim et al. | |

* cited by examiner

SEMICONDUCTOR PACKAGE

CROSS-REFERENCE TO RELATED APPLICATION

A claim of priority under 35 U.S.C. § 119 is made to Korean Patent Application No. 10-2022-0106352, filed on Aug. 24, 2022, in the Korean Intellectual Property Office, the disclosure of which is incorporated by reference herein in its entirety.

BACKGROUND

The inventive concept relates to a semiconductor package, and more particularly, to a semiconductor package exhibiting favorable thermal properties.

With the rapid development of the electronics industry and user demands, electronic devices have become more compact and lightweight. As a result, semiconductor packages used in such devices have also become more compact and lightweight. In the meantime, as the performance and capacity of the semiconductor packages continues to increase, the power consumption of the semiconductor packages is also increasing. This combination of smaller size and higher power consumption makes it increasingly important that the semiconductor packages exhibit favorable heat dissipation characteristics.

SUMMARY

According to an aspect of the inventive concept, a semiconductor package is provided which includes a package substrate, and a first semiconductor chip including a semiconductor substrate having an active surface and an inactive surface opposite to the active surface, the semiconductor chip disposed on the package substrate such that the active surface faces the package substrate. The semiconductor package further includes an encapsulant surrounding the semiconductor chip, and a first redistribution structure on the encapsulant, and including a thermally conductive pattern, a heat-conducting through via providing a path for heat to conduct from the semiconductor substrate to the thermally conductive pattern, and a redistribution insulating layer surrounding the heat-conducting through via. The semiconductor substrate includes a first contact region having a higher temperature than a surrounding area on the inactive surface, and the heat-conducting through via passes through the encapsulant and contacts the first contact region.

According to another aspect of the inventive concept, a semiconductor package is provided which includes a package substrate, and a semiconductor chip including a semiconductor substrate having an active surface and an inactive surface opposite to the active surface, the semiconductor chip being disposed on the package substrate such that the active surface faces the package substrate. The semiconductor package further includes an encapsulant surrounding the semiconductor chip, and including a thermally conductive pattern and a heat-conducting through via providing a path for heat to conduct from the semiconductor substrate to the thermally conductive pattern. The semiconductor substrate includes a first contact region having a higher temperature than a surrounding area on the inactive surface, the heat-conducting through via passes through the encapsulant and is in contact with the first contact region, and the encapsulant surrounds the heat-conducting through via.

According to another aspect of the inventive concept, a semiconductor package is provided which includes a first redistribution structure, and a semiconductor chip including a semiconductor substrate having an active surface and an inactive surface opposite to the active surface, and a device layer formed on the active surface and having a plurality of semiconductor devices formed thereon, the semiconductor chip mounted on the first redistribution structure such that the device layer faces the first redistribution structure. The semiconductor packages further includes an encapsulant surrounding the semiconductor chip, and a second redistribution structure on the encapsulant and including a thermally conductive pattern and a plurality of heat-conducting through vias providing a path for heat to conduct from the semiconductor substrate to the thermally conductive pattern. The semiconductor substrate includes a first contact region on the inactive surface, and the plurality of heat-conducting through vias pass through the encapsulant and contact with a lower pad formed in the second redistribution structure.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
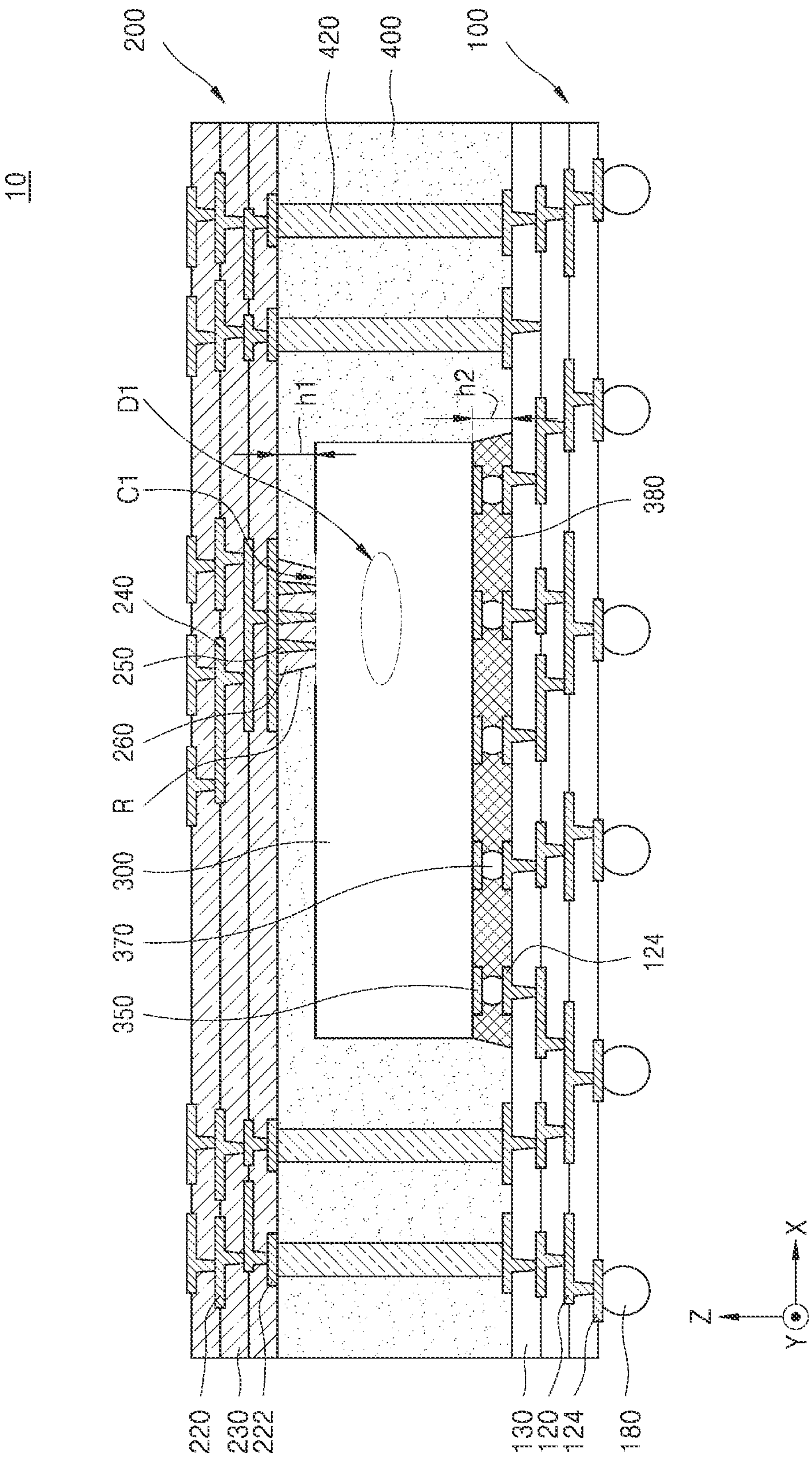
FIG. 1 is a cross-sectional view schematically illustrating a semiconductor package according to an embodiment.

Hereinafter, embodiments of the inventive concept will be described in detail with reference to the accompanying drawings. Like reference numerals in the accompanying drawings refer to like elements throughout, and duplicate descriptions thereof are omitted.

Figure 2:
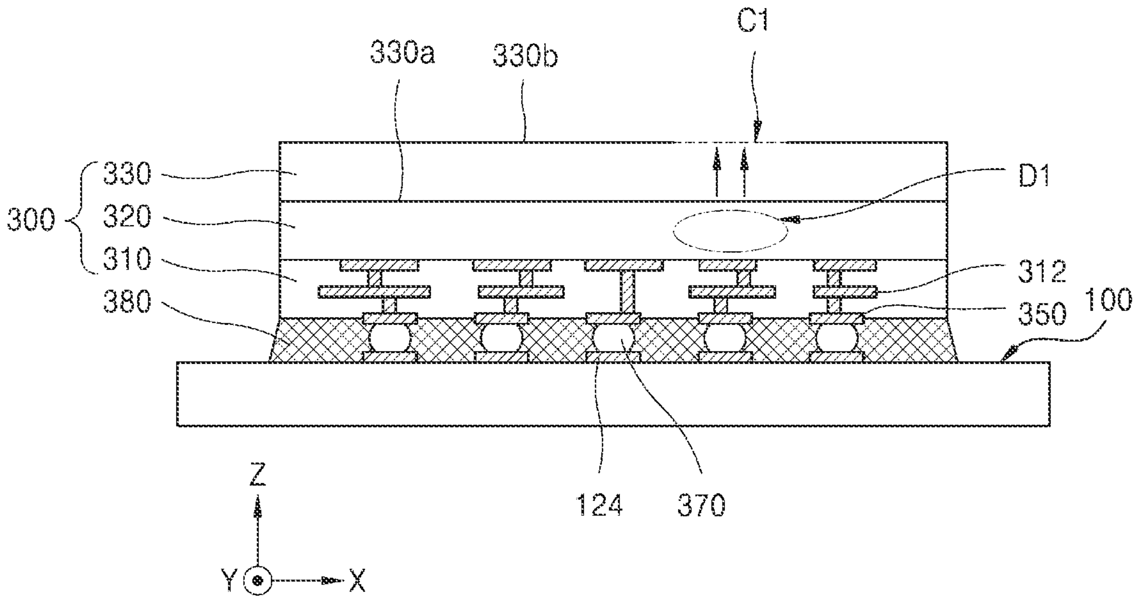
FIG. 2 is a cross-sectional view illustrating the inside of a first semiconductor chip of the semiconductor package of FIG. 1.
Figure 3:
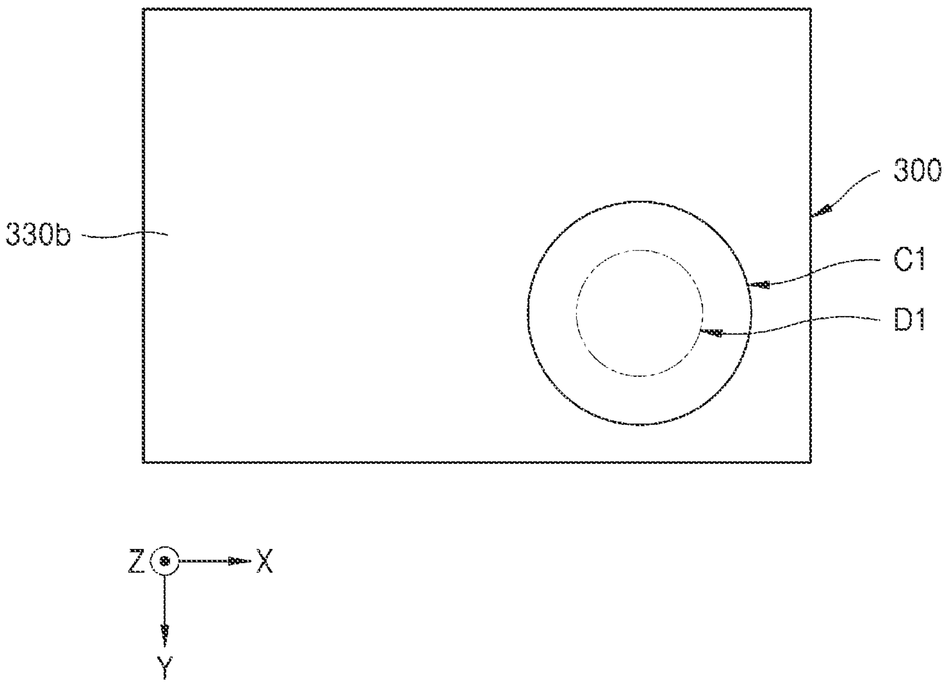
FIG. 3 is a plan view schematically illustrating the first semiconductor chip of FIG. 1.

FIG. 1 is a cross-sectional view schematically illustrating a semiconductor package according to an embodiment. FIG. 2 is a cross-sectional view illustrating the inside of a first semiconductor chip of the semiconductor package of FIG. 1. FIG. 3 is a plan view schematically illustrating the first semiconductor chip of FIG. 1.

Referring to FIGS. 1 to 3, a semiconductor package 10 of the present embodiment may include a first substrate 100, a first semiconductor chip 300, an encapsulant 400, a conductive pillar 420, and a first redistribution structure 200, and an external connection terminal 180.

The first substrate 100 be referred to as a package substrate, may be located under the first semiconductor chip

300, and may electrically connect the first semiconductor chip 300 to the external connection terminal 180. The first substrate 100 may include a wiring insulating layer 130 and a wiring pattern 120 formed in the wiring insulating layer 130.

The wiring insulating layer 130 may include a plurality of insulating layers stacked in a given direction, and the wiring pattern 120 may include a plurality of patterns formed in the stacked insulating layers.

In the drawings and description below, the given direction in which the plurality of insulating layers is stacked may be considered a Z-axis direction. An X-axis direction and a Y-axis direction may be considered as directions perpendicular to each other in a plane having the Z-axis direction as a normal vector. That is, the X-axis direction and the Y-axis direction indicate a direction parallel to the top surface or the bottom surface of the first substrate 100, and the X-axis direction and the Y-axis direction may be perpendicular to each other. The Z-axis direction may indicate a direction perpendicular to the top surface or bottom surface of the first substrate 100, that is, a direction perpendicular to the X-Y plane. In addition, in the drawings and description below, a first horizontal direction may be understood as an X-axis direction, a second horizontal direction may be understood as a Y-axis direction, and a vertical direction may be understood as a Z-axis direction.

The first substrate 100 may electrically connect the first semiconductor chip 300 to the external connection terminal 180 through the wiring pattern 120 formed in the wiring insulating layers 130 stacked in the vertical direction Z. The wiring pattern 120 may be provided in the wiring insulating layer 130, and may be formed to pass through the first substrate 100 from the top surface to the bottom surface of the first substrate 100 to thereby serve as an electrical connection path.

The wiring pattern 120 may include wiring line patterns respectively extending in a horizontal direction in the stacked wiring insulating layers 130, and wiring via patterns electrically connecting the wiring line patterns to one another. The wiring via patterns may pass through the wiring insulating layer 130 in the vertical direction Z to electrically connect the wiring line patterns respectively provided in the vertically adjacent wiring insulating layers 130.

The wiring pattern 120 may further include substrate pads 124 formed on the top surface and bottom surface of the first substrate 100. The substrate pads 124 may be wiring patterns formed on the top and bottom surfaces of the first substrate 100 among the wiring patterns 120 and exposed from the wiring insulating layer 130. A plurality of substrate pads 124 may be provided. Some of the substrate pads 124 formed on the top surface of the first substrate 100 may be electrically connected to a first semiconductor chip pad 350 through a first bump structure 370, and some others of the substrate pads 124 may be electrically connected to the conductive pillars 420. The substrate pads 124 formed on the bottom surface of the first substrate 100 may be electrically connected to the external connection terminals 180.

In some embodiments, the semiconductor package 10 may have a wafer level package (WLP) structure. According to some embodiments, in this case, the first substrate 100 may be understood as a redistribution structure manufactured through a redistribution process, and each of the wiring insulating layer 130 and the wiring pattern 120 may be understood as a redistribution insulating layer and a redistribution pattern.

The redistribution structure may electrically connect the first semiconductor chip 300 to the external connection terminal 180. For example, the package redistribution insulating layer may be formed from photo imageable dielectric (PID) or photosensitive polyimide (PSPI). For example, the redistribution pattern may include metal, such as Cu, Al, W, Ti, Ta, In, Mo, Mn, Co, Sn, Ni, Mg, Re, Be, Ga, or Ru, or an alloy thereof, but the inventive concept is not limited thereto. In some embodiments, the redistribution pattern may be formed by laminating a metal or an alloy of a metal on a seed layer including copper, titanium, titanium nitride, or titanium tungsten.

The redistribution pattern may include a redistribution line pattern and a redistribution via pattern. In some embodiments, the redistribution via patterns may have a tapered shape of which a horizontal width increases from a lower side to an upper side thereof. For example, the horizontal width of the plurality of redistribution via patterns may increase in a direction towards the first semiconductor chip 300. In some embodiments, at least some of the plurality of redistribution line patterns may be integrally formed with some of the plurality of redistribution via patterns to form an integral body.

In some embodiments, the first substrate 100 may redistribute the first semiconductor chip pad 350 to an external region of the first semiconductor chip 300. In this case, the semiconductor package 10 may be a fan out semiconductor package in which the footprint of the first substrate 100 is greater than that of the first semiconductor chip 300. That is, the horizontal width and horizontal area of the first substrate 100 may be greater than the horizontal width and horizontal area of the first semiconductor chip 300, respectively. In some embodiments, the semiconductor package 10 may be a fan out wafer level package (FOWLP) in which the first substrate 100 has a redistribution structure.

Although it is illustrated in the drawings that the first substrate 100 has a redistribution structure, the inventive concept is not limited thereto, and the first substrate 100 may be formed based on a ceramic substrate, a printed circuit board (PCB), an organic substrate, an interposer substrate, etc. depending on the intended purpose of the arrangement.

The external connection terminal 180 may be positioned on the substrate pad 124 formed on the bottom surface of the first substrate 100. The external connection terminal 180 may be electrically connected to an external device, for example, a motherboard. The external connection terminal 180 may be electrically connected to the substrate pad 124. The external connection terminal 180 may be electrically connected to the wiring patterns 120 through the substrate pad 124. The external connection terminal 180 may electrically and physically connect the semiconductor package 10 to an external device, on which the semiconductor package 10 is mounted.

The first semiconductor chip 300 may be on the top surface of the first substrate 100. For example, the first semiconductor chip 300 may be mounted on the first substrate 100 through the first bump structure 370, such as a micro bump in a flip chip method. The first bump structure 370 may include a conductive material, for example, at least one of solder, tin (Sn), silver (Ag), copper (Cu), and aluminum (Al). In some embodiments, an underfill material layer 380 surrounding the first bump structure 370 may be between the first semiconductor chip 300 and the first substrate 100. The underfill material layer 380 may include, for example, an epoxy resin formed using a capillary underfill method. However, in some embodiments, the encapsulant 400 may be directly filled into the gap between the first semiconductor chip 300 and the first substrate 100 through a molded under-fill process. In this case, the underfill material layer 380 may be omitted.

The first semiconductor chip 300 may be in a central portion of the first substrate 100 in the first horizontal direction X. In addition, the first semiconductor chip 300 may also be in a central portion of the first substrate 100 in the second horizontal direction Y.

The first semiconductor chip 300 may include a logic semiconductor chip. For example, the logic semiconductor chip may include an application processor (AP), a microprocessor, a central processing unit (CPU), a controller, or an application specific integrated circuit (ASIC). The first semiconductor chip 300 may constitute a graphic processor unit (GPU)/CPU/system-on-chip (SOC), etc., and the semiconductor package 10 may be divided into a server-oriented semiconductor device, a mobile-oriented semiconductor device, or the like depending on the type of the first semiconductor chip 300. Moreover, the first semiconductor chip 300 is not limited to a logic semiconductor chip. For example, in some embodiments, the first semiconductor chip 300 may be a memory semiconductor chip.

As shown in FIG. 2, the first semiconductor chip 300 may include a semiconductor substrate 330, a device layer 320, and a metal wiring layer 310.

The semiconductor substrate 330 may have an active surface 330*a* and an inactive surface 330*b* opposite to the active surface 330*a*, and when the first semiconductor chip 300 is mounted on the first substrate 100 in a flip-chip method, the active surface 330*a* may face the first substrate 100.

The semiconductor substrate 330 may include silicon (Si), for example, crystalline silicon, polycrystalline silicon, or amorphous silicon. Alternatively, the semiconductor substrate 330 may include a semiconductor element, such as germanium (Ge), or a compound semiconductor, such as silicon carbide (SiC), gallium arsenide (GaAs), indium arsenide (InAs), or indium phosphide (InP). Moreover, the semiconductor substrate 330 may have a silicon-on-insulator (SOI) structure. For example, the semiconductor substrate 330 may include a buried oxide (BOX) layer. For example, the semiconductor substrate 330 may include a conductive region, e.g., an impurity-doped well or an impurity-doped structure. In addition, the semiconductor substrate 330 may have one of various device isolation structures, such as a shallow trench isolation (STI) structure.

The semiconductor substrate 330 may include a first contact region C1 on the inactive surface 330*b*, which is a region having a relatively higher temperature than the surrounding area. That is, the first contact region C1 may be a region in which heat concentrates on the inactive surface 330*b* of the semiconductor substrate 330. In some embodiments, the first contact region C1 may be a region having a temperature that is higher than the average temperature of the inactive surface 330*b* by more than a standard deviation, but the inventive concept is not limited thereto, and the first contact region C1 may be a region having a temperature that is higher than the average temperature of the inactive surface 330*b* on the inactive surface 330*b* or a region having a temperature T1 or higher on the inactive surface 330*b*.

In some embodiments, when a heat source is present in the device layer 320, the first contact region C1 may correspond to a region overlapping the heat source in the vertical direction Z on the inactive surface 330*b*. In some embodiments, the first contact region C1 may be formed in a partial region of the inactive surface 330*b* and may have an area of 9 $mm^2$ to 16 $mm^2$, but the inventive concept is not limited thereto, and the area may vary depending on the type and design of the first semiconductor chip 300.

The device layer 320 may be formed on the active surface 330*a* of the semiconductor substrate 330. The device layer 320 may include a plurality of semiconductor devices and an interlayer insulating film covering the semiconductor devices. The semiconductor devices may include, for example, switching devices, such as transistors.

The device layer 320 may further include a first dense region D1. The first dense region D1 may be a region in which semiconductor devices are more densely spaced together than a remainder of the device layer. That is, the first dense region D1 may be a region where the density of semiconductor devices (i.e., a number of semiconductor devices per unit area) is relatively high in the device layer 320. In some embodiments, the first dense region D1 may be a region in the device layer 320, in which transistors are denser than in a peripheral region. Because the first dense region D1 is a region in which semiconductor devices are dense, the first dense region D1 may be a region in which the most heat is generated in the device layer 320 during device operation.

Some of the heat generated in the first dense region D1 may move toward the semiconductor substrate 330. In some embodiments, the heat that has moved to the semiconductor substrate 330 may move in the vertical direction Z as shown in FIG. 2. That is, heat may move in the vertical direction Z from the active surface 330*a* of the semiconductor substrate 330 to the inactive surface 330*b* of the semiconductor substrate 330. The temperature of the semiconductor substrate 330 increases due to the heat. In this case, the first contact region C1 having a temperature higher than that of the surrounding region in the inactive surface 330*b* may be defined. In some embodiments, because the heat moves from the first dense region D1 to the inactive surface 330*b* of the semiconductor substrate 330 in a vertical direction, the first contact region C1 may be positioned above the first dense region D1 in the vertical direction Z. In other words, the first dense region D1 may overlap the first contact region C1 in the vertical direction.

The metal wiring layer 310 may connect a plurality of semiconductor devices in the device layer 320 to the wiring pattern 120 formed on the first substrate 100. The metal wiring layer 310 may include a metal wiring pattern 312. The metal wiring pattern 312 may include a metal wiring line pattern and a metal wiring via pattern. The metal wiring layer 310 may have a multilayered structure in which metal wiring line patterns and metal wiring via patterns are alternately stacked. The metal wiring layer 310 may further include a first semiconductor chip pad 350. The first semiconductor chip pad 350 may be formed on the bottom surface of the metal wiring layer 310 to contact the first bump structure 370. The first semiconductor chip pad 350 may electrically connect the metal wiring pattern 312 to the first bump structure 370. In some embodiments, the first semiconductor chip pad 350 may be a pattern formed during the metal wiring pattern 312 process. The plurality of semiconductor devices may be electrically connected to the wiring pattern 120 of the first substrate 100 through the metal wiring pattern 312, the first semiconductor chip pad 350, the first bump structure 370, and the substrate pad 124.

The encapsulant 400 may be formed between the first substrate 100 and the first redistribution structure 200. The encapsulant 400 may be formed to surround the first semiconductor chip 300 on the top surface of the first substrate 100. The encapsulant 400 may include a recess R extending from the top surface of the encapsulant 400 to a surface contacting the top surface of the first semiconductor chip 300. That is, the encapsulant 400 may include a groove extending from the top surface of the encapsulant 400 to a surface contacting the top surface of the first semiconductor chip 300. In addition, the top surface of the first semiconductor chip 300 may be understood as an inactive surface of the semiconductor substrate 330. The recess R may be filled with a second redistribution insulating layer 260 and a heat-conducting through via 250, which will be described below. In some embodiments, the recess R may have a tapered shape in which the horizontal width thereof decreases as the vertical level decreases.

The encapsulant 400 may be formed of a thermosetting resin, such as an epoxy resin, a thermoplastic resin, such as polyimide, or a resin containing a reinforcing material, such as an inorganic filler therein, specifically Ajinomoto Build-up Film (ABF), FR-4, BT, or the like, but the inventive concept is not limited thereto, and the encapsulant 400 may be formed of a molding material, such as EMC or a photosensitive material such as a photoimageable encapsulant (PIE). In some embodiments, a portion of the encapsulant 400 may include an insulating material, such as a silicon oxide film, a silicon nitride film, or a silicon oxynitride film.

The conductive pillar 420 may be between the first substrate 100 and the first redistribution structure 200. As the encapsulant 400 is arranged between the first substrate 100 and the first redistribution structure 200, the conductive pillar 420 may extend through the encapsulant 400 in the vertical direction Z. The conductive pillar 420 may be apart from the first semiconductor chip 300 in the first horizontal direction X or the second horizontal direction Y. The lower end of the conductive pillar 420 may be in contact with the substrate pad 124 formed on the top surface of the first substrate 100, and the upper end of the conductive pillar 420 may be in contact with a lower pad 222 formed on the bottom surface of the first redistribution structure 200. The conductive pillar 420 may electrically connect the substrate pad 124 formed on the top surface of the first substrate 100 to the lower pad 222. The conductive pillar 420 may electrically connect the first substrate 100 to the first redistribution structure 200 through the substrate pad 124 and the lower pad 222 formed on the top surface of the first substrate 100.

The first redistribution structure 200 may be on the conductive pillar 420 and the encapsulant 400. The first redistribution structure 200 may include a redistribution pattern 220, a first redistribution insulating layer 230, a thermally conductive pattern 240, a heat-conducting through via 250, and the second redistribution insulating layer 260. Because the redistribution pattern 220 and the first redistribution insulating layer 230 may be substantially the same as or similar to the redistribution pattern and the redistribution insulating layer respectively corresponding to the wiring pattern 120 and the wiring insulating layer 130 of the first substrate 100, redundant descriptions thereof are omitted, and descriptions below will be focused on the differences. The redistribution pattern 220 may be formed in the first redistribution insulating layers 230 stacked in the vertical direction Z. The redistribution pattern 220 may be formed to pass through the first redistribution structure 200 from the top surface of the first redistribution structure 200 to the bottom surface of the first redistribution structure 200 to serve as an electrical connection path. The redistribution pattern 220 may be electrically connected to the conductive pillar 420.

The redistribution pattern 220 may include redistribution line patterns respectively extending in a horizontal direction in the stacked first redistribution insulating layers 230, and redistribution via patterns electrically connecting the redistribution line patterns. The redistribution via patterns may pass through the first redistribution insulating layer 230 in the vertical direction Z to electrically connect the redistribution line patterns respectively provided in the vertically adjacent first redistribution insulating layers 230.

The redistribution pattern 220 may further include a lower pad 222 formed on the bottom surface of the first redistribution structure 200. The lower pad 222 may be a redistribution pattern formed on the bottom surface of the first redistribution structure 200 among the redistribution patterns 220 and exposed from the first redistribution insulating layer 230. A plurality of lower pads 222 may be provided. The lower pads 222 formed on the bottom surface of the first redistribution structure 200 may be electrically connected to the conductive pillar 420. Accordingly, the redistribution pattern 220 may be electrically connected to the wiring pattern 120 through the conductive pillar 420.

The heat-conducting through via 250 may be formed on the top surface of the first semiconductor chip 300, that is, on the first contact region C1 of the inactive surface 330*b* of the semiconductor substrate 330. The heat-conducting through via 250 may pass through the encapsulant 400 from the top surface of the encapsulant 400 to the first contact region C1. That is, the heat-conducting through via 250 may pass through a partial region of the encapsulant 400 and be formed to contact the first contact region C1. The heat-conducting through via 250 may have a shape extending in the vertical direction Z on the first contact region C1. In some embodiments, the heat-conducting through via 250 may have a tapered shape of which a horizontal width increases from a lower side to an upper side thereof. For example, the horizontal width of the heat-conducting through via 250 may be reduced in a direction towards the first contact region C1. A plurality of heat-conducting through vias 250 may be provided. In this case, each of the heat-conducting through vias 250 may be provided to be apart from each other in the horizontal direction (X, Y).

The heat-conducting through via 250 may provide a path through which heat may move from the semiconductor substrate 330 to the thermally conductive pattern 240. The heat-conducting through via 250 may transfer heat from the first contact region C1 to the thermally conductive pattern 240. In some embodiments, the heat-conducting through via 250 may transfer heat from the first contact region C1 to the thermally conductive pattern 240 through conduction. The heat-conducting through via 250 may be formed of a material having high thermal conductivity. In some embodiments, the heat-conducting through via 250 may be formed of a material having a higher thermal conductivity than a material constituting the encapsulant 400. In some embodiments, the heat-conducting through via 250 may include copper.

The heat-conducting through via 250 may be provided in the second redistribution insulating layer 260. In some embodiments, the second redistribution insulating layer 260 may have a shape extending in the vertical direction Z while surrounding the heat-conducting through via 250. In some embodiments, the second redistribution insulating layer 260 may be formed from PID. In addition, because the second redistribution insulating layer 260 may be made of a material that is substantially the same as or similar to that of the first redistribution insulating layer 230, redundant descriptions thereof are omitted.

In some embodiments, a length h1 in the vertical direction Z of the heat-conducting through via 250 may be substantially the same depth as the recess R formed in the encapsulant 400. In addition, the h1 may be substantially the same as h2, which is a distance from the bottom surface of the first semiconductor chip 300 to the top surface of the first substrate 100. That is, the h1 may be substantially equal to the distance from the top surface of the first semiconductor chip pad 350 to the bottom surface of the substrate pad 124 formed on the top surface of the first substrate 100.

The thermally conductive pattern 240 is provided in the first redistribution insulating layer 230 and may be physically connected to the heat-conducting through via 250. In some embodiments, the thermally conductive pattern 240 may discharge heat transferred from the heat-conducting through via 250 to the outside. In some embodiments, the thermally conductive pattern 240 may be formed through substantially the same process as that of the redistribution pattern 220. The thermally conductive pattern 240 may be made of the same material as the redistribution pattern 220, but the inventive concept is not limited thereto, and may be used in a redistribution process and may include a material having high thermal conductivity.

The semiconductor package 10 according to an embodiment may include a heat-conducting through via 250 formed to pass through a partial region of the encapsulant 400 and contact the first contact region C1. Accordingly, heat may be efficiently discharged from the first contact region of the first semiconductor chip 300 to the outside through the heat-conducting through via 250 and the thermally conductive pattern 240. That is, heat generated from the first semiconductor chip 300 may be effectively discharged to the outside through the heat-conducting through via 250 and the first redistribution structure 200.

In addition, since the heat-conducting through via 250 is formed to pass through only a partial region of the encapsulant 400, the encapsulant 400 may still fix the first semiconductor chip 300 except for a portion corresponding to the first contact region C1 in the encapsulant 400. Accordingly, the semiconductor package 10 according to the inventive concept may efficiently dissipate heat generated in the first semiconductor chip 300, and at the same time, prevent warpage from occurring in the first semiconductor chip 300.

In some embodiments, because h1, which is the distance from the top surface of the first semiconductor chip 300 to the top surface of the encapsulant 400, is substantially equal to h2, which is the distance from the bottom surface of the first semiconductor chip 300 to the top surface of the first substrate 100, warpage may be prevented from occurring in the first semiconductor chip 300.

Figure 4:
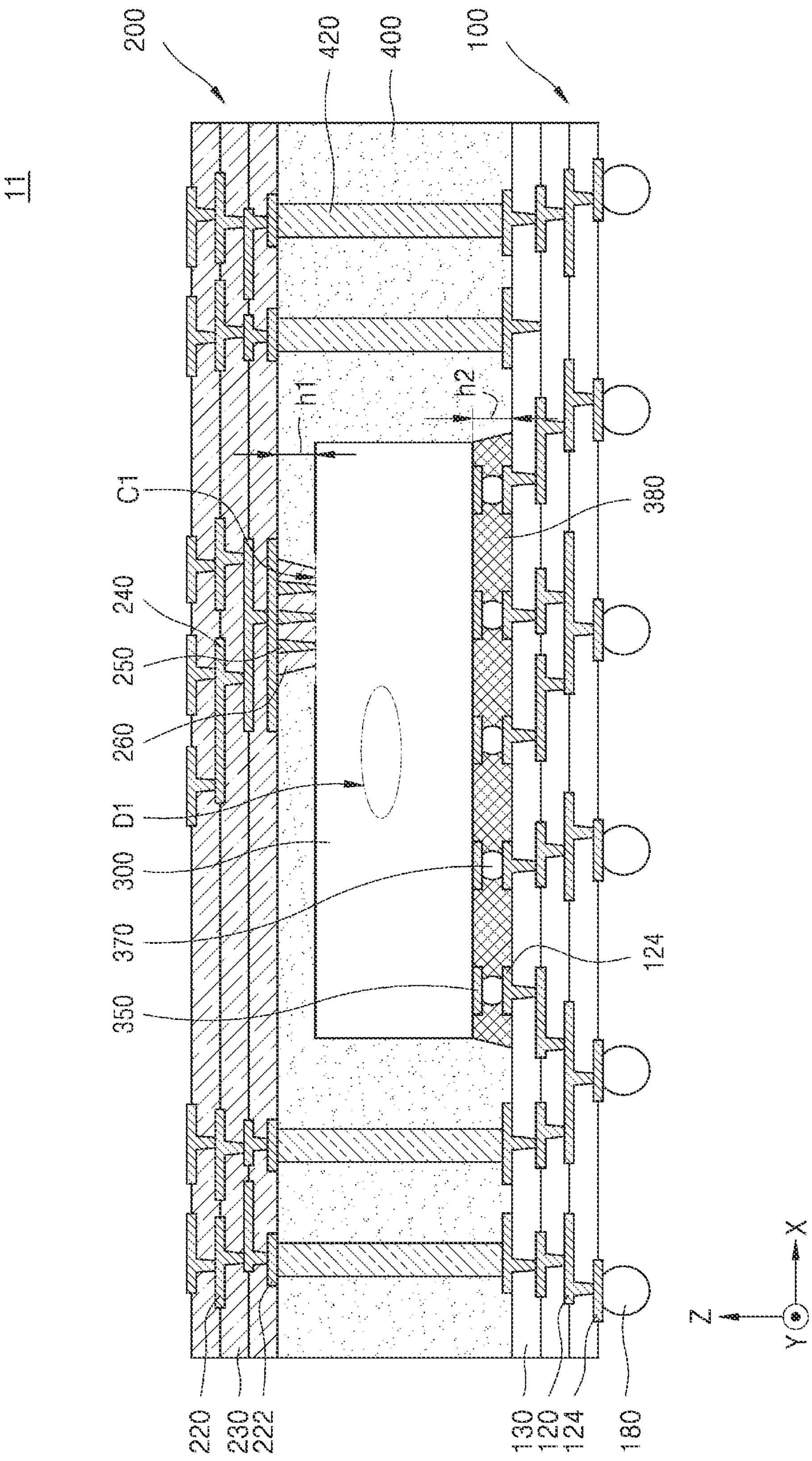
FIG. 4 is a cross-sectional view schematically illustrating a semiconductor package according to an embodiment.
Figure 5:
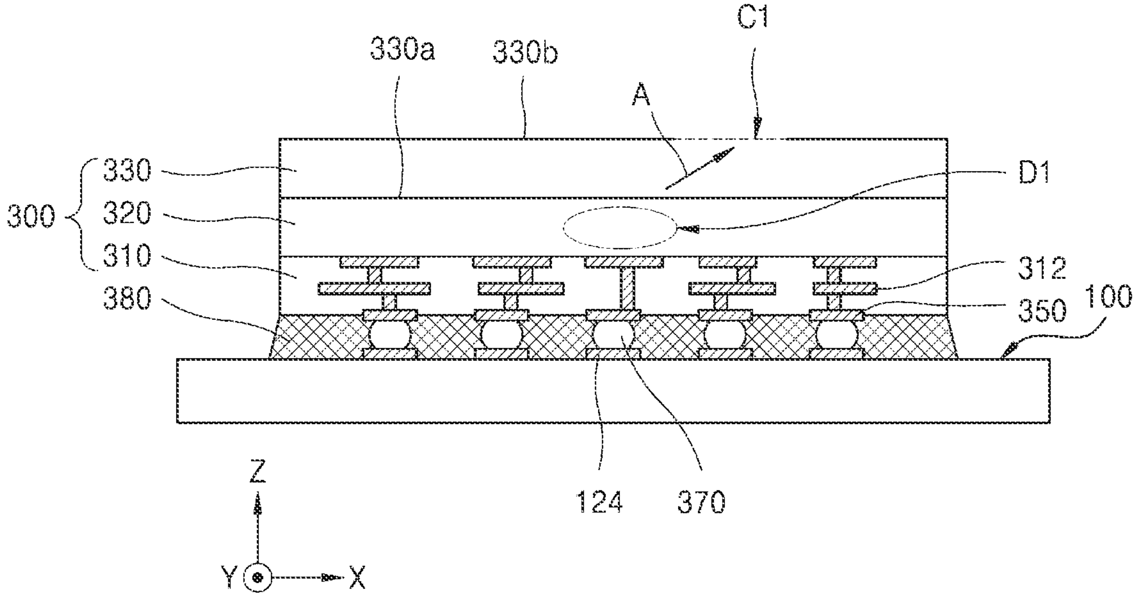
FIG. 5 is a cross-sectional view illustrating the inside of the first semiconductor chip of FIG. 4.
Figure 6:
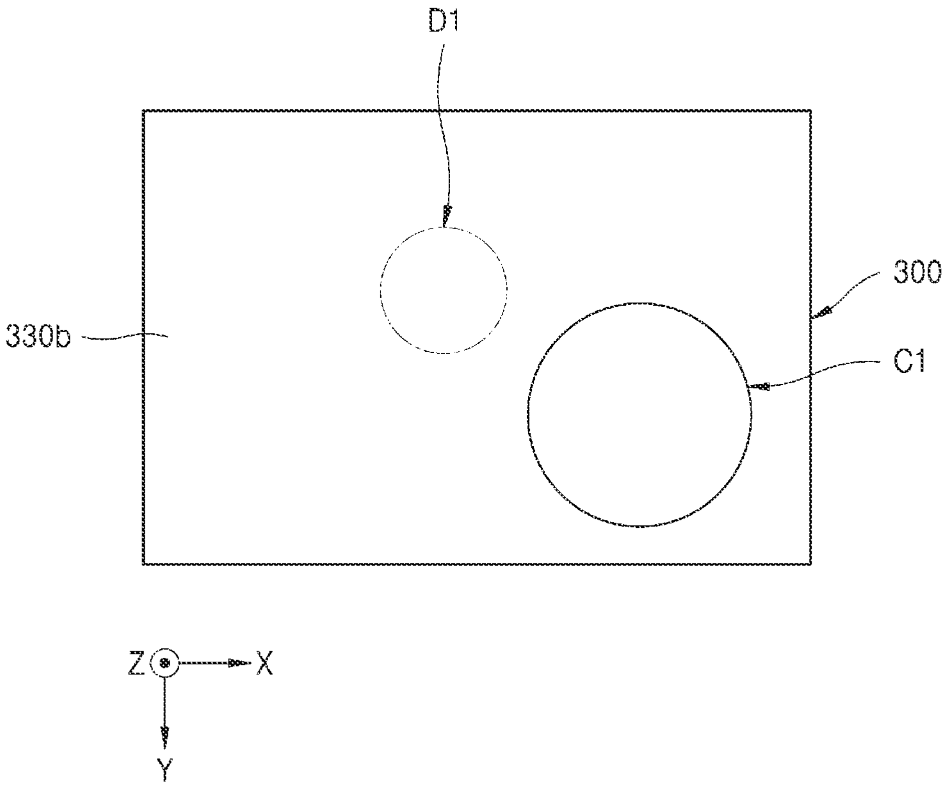
FIG. 6 is a plan view schematically illustrating the first semiconductor chip of FIG. 4.

FIG. 4 is a cross-sectional view schematically illustrating a semiconductor package according to an embodiment. FIG. 5 is a cross-sectional view illustrating the inside of the first semiconductor chip of FIG. 4. FIG. 6 is a plan view schematically illustrating the first semiconductor chip of FIG. 4. Hereinafter, redundant descriptions of the semiconductor package 10 of FIG. 1 are omitted from the descriptions of a semiconductor package 11 of FIG. 4, and descriptions below will be focused on differences between the semiconductor packages 10 and 11.

Referring to FIGS. 4 to 6, the semiconductor package 11 may include a first substrate 100, a first semiconductor chip 300, an encapsulant 400, a conductive pillar 420, and a first redistribution structure 200, and an external connection terminal 180.

The first semiconductor chip 300 may include a semiconductor substrate 330, a device layer 320, and a metal wiring layer 310, the semiconductor substrate 330 may include a first contact region C1, and the device layer 320 may include a first dense region D1.

The first redistribution structure 200 may include a redistribution pattern 220, a first redistribution insulating layer 230, a heat-conducting through via 250, a second redistribution insulating layer 260, and a thermally conductive pattern 240.

In the semiconductor package 11 according to an embodiment, the first dense region D1 of the device layer 320 may not overlap the first contact region C1 on the inactive surface 330*b* of the semiconductor substrate 330 in the vertical direction Z. That is, the first dense region D1 and the first contact region C1 may be diagonally spaced apart along the X-Z plane. When heat is concentrated by dense semiconductor devices in the first dense region D1, heat may move diagonally as in the direction of the arrow A shown in FIG. 5 by the internal structure of the semiconductor substrate 330 or the internal structure of the device layer 320. Accordingly, the first contact region C1, which is a region having a higher temperature than the surrounding area on the inactive surface 330*b* of the semiconductor substrate 330, may be defined as a region which does not overlap the first dense region D1 in the vertical direction Z.

Figure 7:
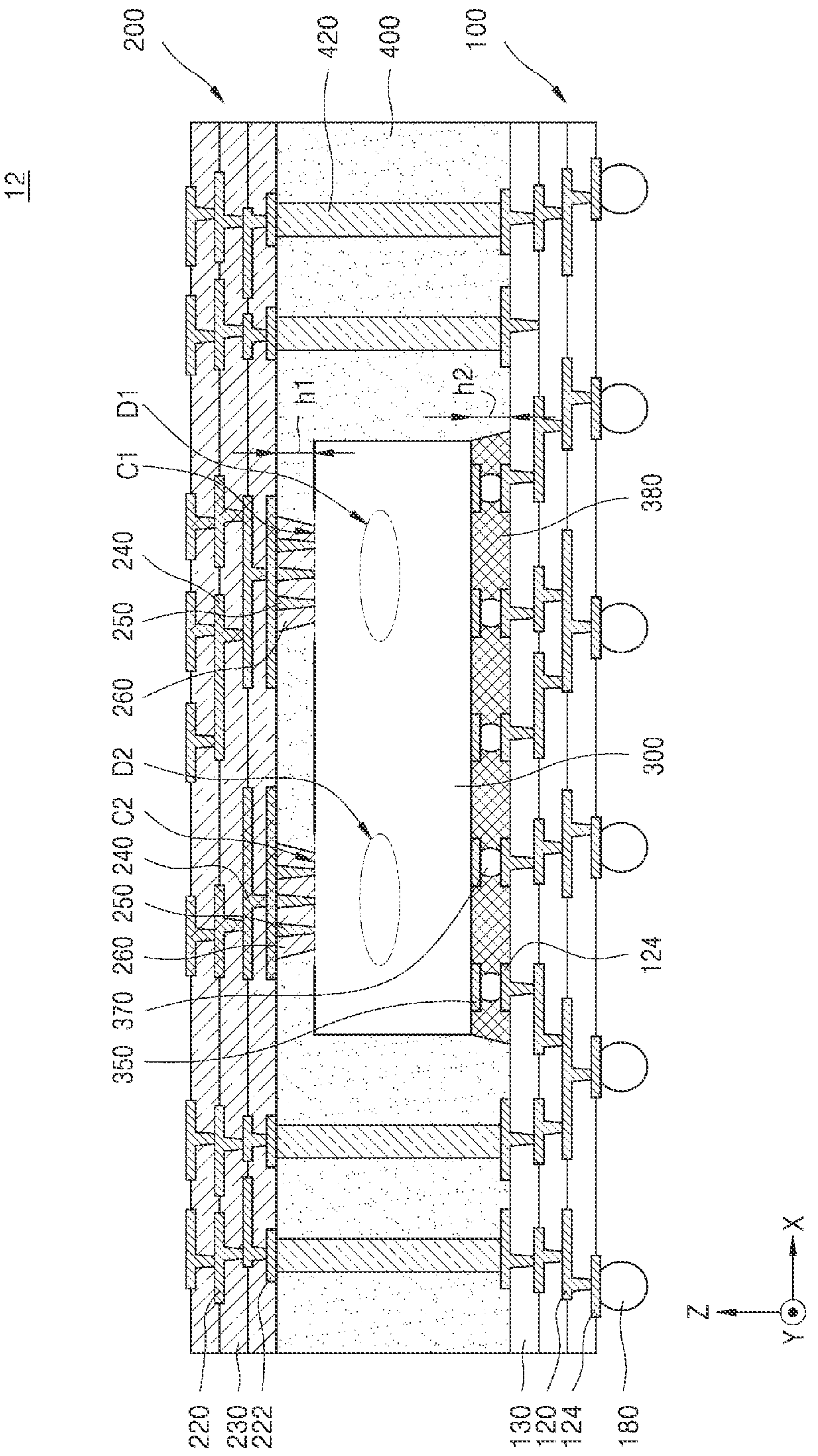
FIG. 7 is a cross-sectional view schematically illustrating a semiconductor package according to an embodiment.

FIG. 7 is a cross-sectional view schematically illustrating a semiconductor package according to an embodiment. Hereinafter, redundant descriptions of the semiconductor package 10 of FIG. 1 are omitted from the descriptions of the semiconductor package 12 of FIG. 7, and descriptions below will be focused on differences between the semiconductor packages 10 and 7.

Referring to FIG. 7, a semiconductor package 12 may include a first substrate 100, a first semiconductor chip 300, an encapsulant 400, a conductive pillar 420, and a first redistribution structure 200, and an external connection terminal 180.

The first semiconductor chip 300 may include a semiconductor substrate 330, a device layer 320, and a metal wiring layer 310, the semiconductor substrate 330 may include a first contact region C1, and the device layer 320 may include a first dense region D1.

The first redistribution structure 200 may include a redistribution pattern 220, a first redistribution insulating layer 230, a heat-conducting through via 250, a second redistribution insulating layer 260, and a thermally conductive pattern 240.

In the semiconductor package 12 according to an embodiment, a first dense region D1 and a second dense region D2 may be formed in the device layer 320. The second dense region D2 may be a region, in which devices are densely located in a region that is different from the first dense region D1, in the device layer 320. That is, the second dense region D2 may be a region, in which devices are relatively densely located in a region other than the first dense region D1, in the device layer 320. In some embodiments, a plurality of regions in which semiconductor devices are denser than the surrounding area may be formed in the device layer 320, and although the number of dense regions is shown as one or two in the drawings, the inventive concept is not limited thereto, and the number of dense regions may be 3 or higher.

As the first dense region D1 and the second dense region D2 are formed, a second contact region C2 may be formed on the inactive surface 330*b* of the semiconductor substrate 330 in addition to the first contact region C1. The second contact region C2 may be a region of the inactive surface 330*b* that is different from the first contact region C1 and has a higher temperature than its surrounding region. In other words, the second contact region C2 may be a region of the inactive surface 330*b* which is not the first contact region C1 and has a higher temperature than its surrounding region. That is, at least two regions having a higher temperature than the surrounding area may be provided on the inactive surface 330*b*. Although it is illustrated in drawings that the number of contact regions is one or two, the number of contact regions may be 3 or higher.

As the first contact region C1 and the second contact region C2 are formed, the heat-conducting through via 250 may also be formed in each of the first contact region C1 and the second contact region C2, and a plurality of heat-conducting through vias 250 may be formed in each of the first contact region C1 and the second contact region C2. In addition, in order to form the heat-conducting through via 250, the encapsulant 400 may include a plurality of recesses extending from the top surface of the encapsulant 400 to a surface in contact with the top surface of the first semiconductor chip 300. The number of recesses may be the same as the number of contact regions.

As the heat conduction through via 250 is formed in each of the plurality of contact regions, the semiconductor package 12 may efficiently dissipate heat to the outside, and the vertical stress applied to the heat-conducting through via 250 may be evenly distributed.

Figure 8:
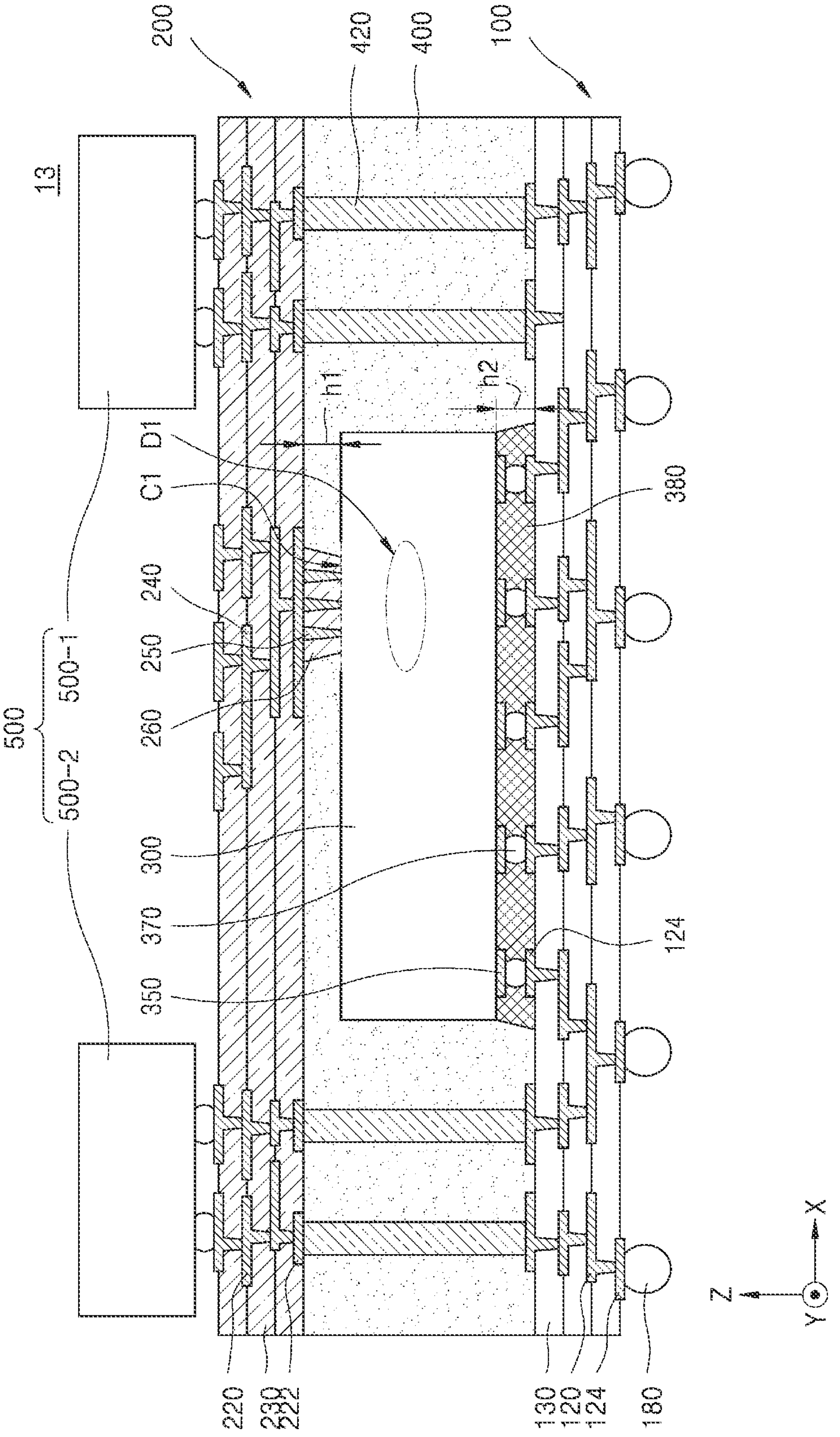
FIG. 8 is a cross-sectional view schematically illustrating a semiconductor package according to an embodiment.

FIG. 8 is a cross-sectional view schematically illustrating a semiconductor package according to an embodiment. Hereinafter, redundant descriptions of the semiconductor package 10 of FIG. 1 are omitted from the descriptions of the semiconductor package 13 of FIG. 8, and descriptions below will be focused on differences between semiconductor packages 10 and 13.

Referring to FIG. 8, the semiconductor package 13 may further include at least one second semiconductor chip 500 mounted on the top surface of the first redistribution structure 200. A second semiconductor chip 500 may be a memory semiconductor chip. For example, the memory semiconductor chip may include, for example, a volatile memory device, such as dynamic random access memory (DRAM) or static RAM (SRAM), or a nonvolatile memory device, such as flash memory. However, the second semiconductor chip 500 is not limited to a memory semiconductor chip. For example, in some embodiments, the second semiconductor chip 500 may be a logic semiconductor chip.

In some embodiments, the second semiconductor chip 500 may be mounted on the first redistribution structure 200 using a flip-chip method through a second bump structure 570, but the inventive concept is not limited thereto, and instead the second semiconductor chip 500 may be on the first redistribution structure 200 through a wire. Because the second bump structure 570 is substantially the same as or similar to the first bump structure 370 described above, redundant descriptions thereof are omitted.

In some embodiments, the semiconductor package 13 may include two second semiconductor chips 500-1 and 500-2 as shown in FIG. 8. The two second semiconductor chips 500-1 and 500-2 may be of the same type or different types. In addition, the number of second semiconductor chips 500 is not limited to two. For example, the semiconductor package 13 may include one or more second semiconductor chips 500. Moreover, the plurality of second semiconductor chips 500 may be on the first redistribution structure 200 in a stack structure. In other words, the plurality of second semiconductor chips 500 may not be adjacent to one another on the first redistribution structure 200 as shown in FIG. 8, and the plurality of second semiconductor chips 500 may be stacked on each other and arranged on the first redistribution structure 200.

Figure 9:
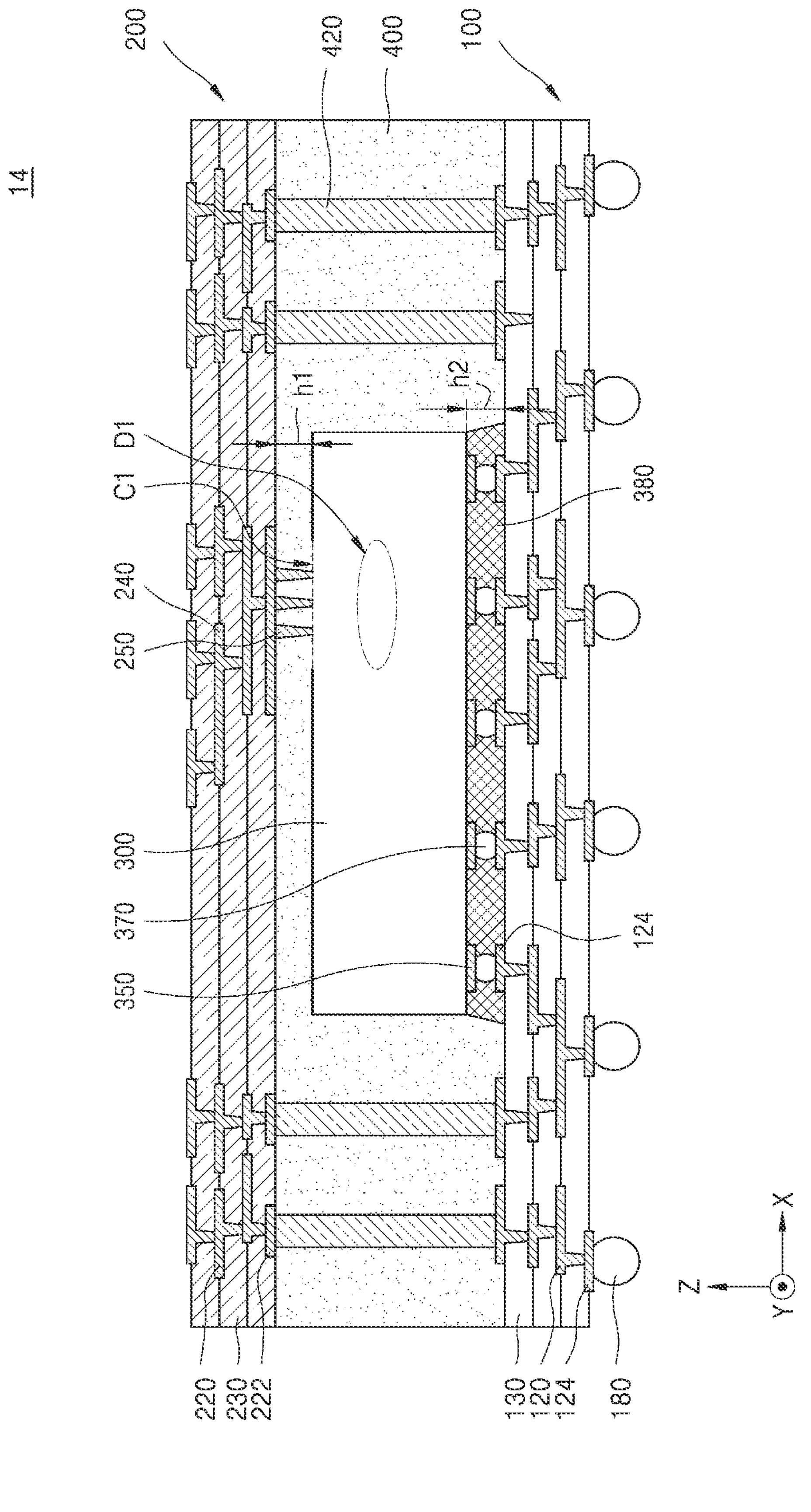
FIG. 9 is a cross-sectional view schematically illustrating a semiconductor package according to an embodiment.

FIG. 9 is a cross-sectional view schematically illustrating a semiconductor package according to an embodiment. Hereinafter, redundant descriptions of the semiconductor package 10 of FIG. 1 are omitted from the descriptions of a semiconductor package 14 of FIG. 9, and descriptions below will be focused on differences between the semiconductor packages 10 and 14.

Referring to FIG. 9, the semiconductor package 14 may include a first substrate 100, a first semiconductor chip 300, an encapsulant 400, a conductive pillar 420, a first redistribution structure 200, and an external connection terminal 180.

The first redistribution structure 200 may include a redistribution pattern 220, a first redistribution insulating layer 230, a heat-conducting through via 250, and a thermally conductive pattern 240.

Unlike the semiconductor package 10 of FIG. 1, the semiconductor package 14 according to an embodiment may have a shape in which the heat-conducting through via 250 is surrounded by the encapsulant 400. In some embodiments, the thermally conductive through via 250 may be formed by a through mold via process. In some embodiments, when the heat-conducting through via 250 is formed by a through mold via process, that is, when the encapsulant 400 surrounds the heat-conducting through via 250, the encapsulant 400 may have a plurality of holes extending from the top surface of the encapsulant 400 to the top surface of the first semiconductor chip 300. The semiconductor package 14 according to an embodiment may have a small area through which the encapsulant 400 passes, because the second redistribution insulating layer 260 is not formed as in the semiconductor package 10 of FIG. 1. That is, because the area of the hole formed in the encapsulant 400 is small, the surface area of the encapsulant 400 in contact with the first semiconductor chip 300 may increase.

Accordingly, the encapsulant 400 more firmly fixes the first semiconductor chip 300, and heat may be dissipated from the first contact region C1 via the first redistribution structure 200 through the heat-conducting through via 250.

FIGS. 10A to 10G are cross-sectional views for reference in describing a method of manufacturing the semiconductor package of FIG. 1. FIGS. 10A to 10G will be described with additional reference to FIG. 1. The description of components of the present embodiment that are the same as those previously described with reference to FIGS. 1 to 9 will be omitted or briefly presented.

Figure 10A:
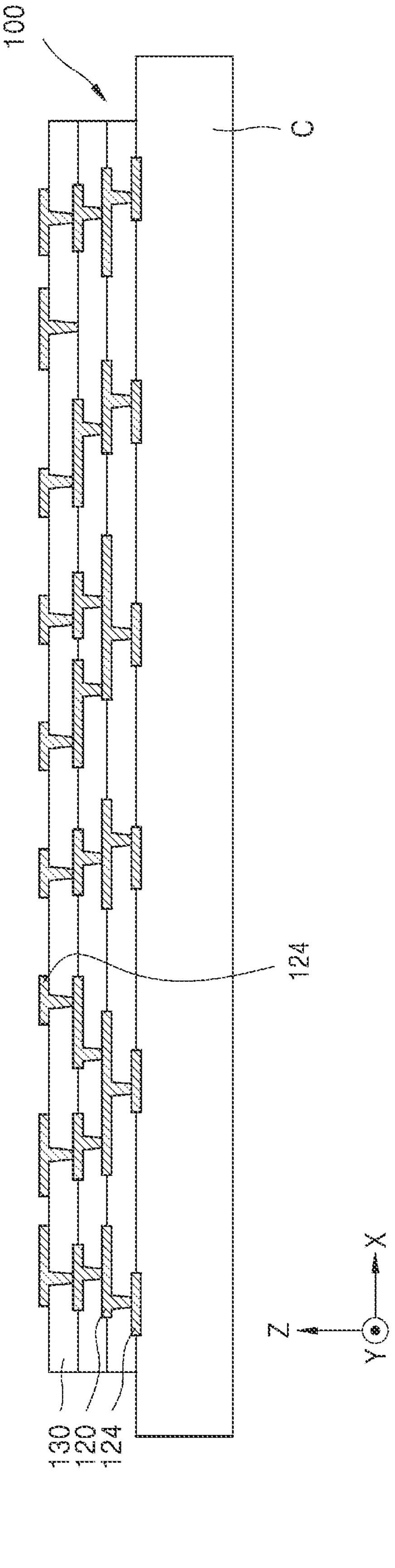
FIGS. 10A to 10G are cross-sectional views for reference in describing a method of manufacturing the semiconductor package of FIG. 1.

Referring to FIG. 10A, in a semiconductor package manufacturing method of the present embodiment, first, a first substrate 100 is formed. The first substrate 100 may include a wiring insulating layer 130 and a wiring pattern 120 as described above. The first substrate 100 may be formed on a carrier substrate C. The carrier substrate C may be a large-sized circular substrate, such as a wafer. In addition, the substrate formed on the carrier substrate C may also be a large-sized circular redistribution substrate including a plurality of first substrates 100. A semiconductor package structure that is separated through a singulation process after subsequent components are formed on the circular redistribution substrate is referred to as a wafer-level package (WLP) structure. However, for convenience of description, only one first substrate 100 and its corresponding components are illustrated in FIGS. 10A and FIGS. 10B to 10G.

Figure 10B:
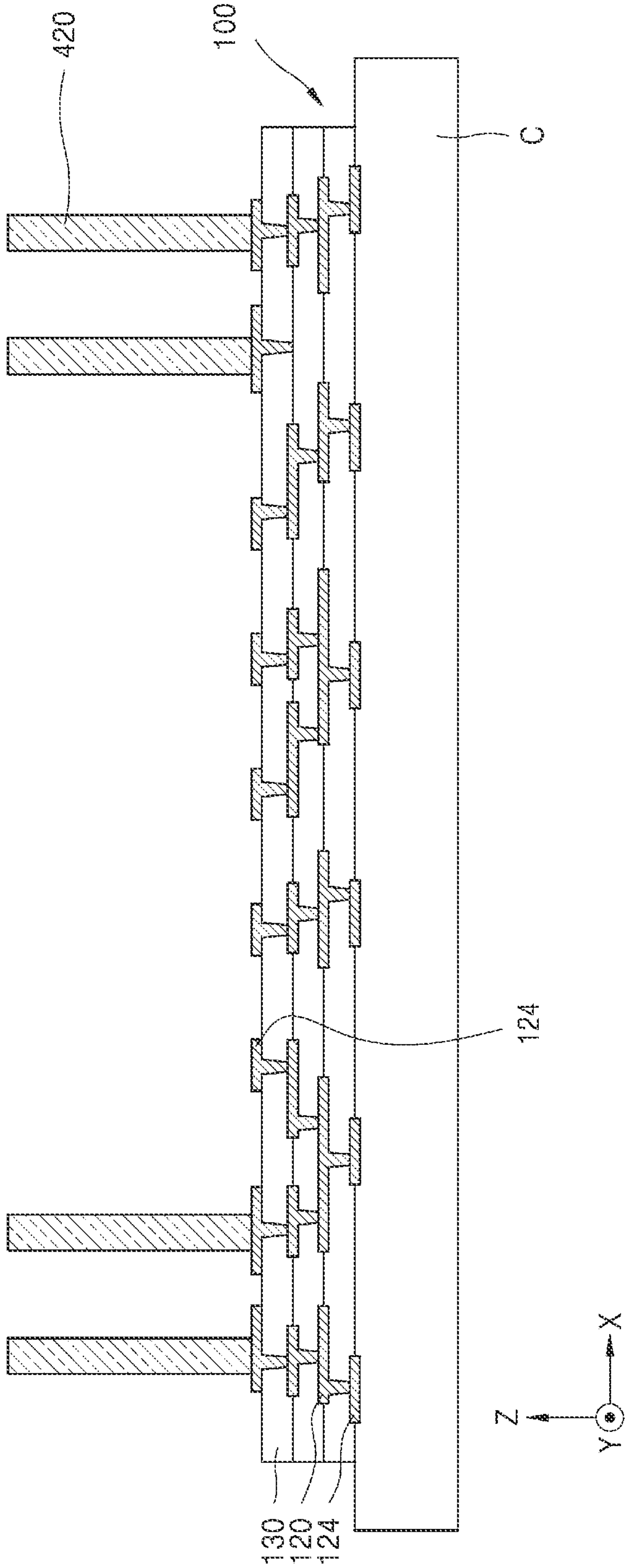

Referring to FIG. 10B, a conductive pillar 420 is formed on the first substrate 100. The conductive pillar 420 may be formed by an electroplating process using a seed metal formed on the first substrate 100. In some embodiments, the seed metal may be formed of copper (Cu), titanium (Ti), tantalum (Ta), titanium nitride (TiN), tantalum nitride (TaN), or the like.

The conductive pillar 420 is coated with a photoresist (PR) on the seed metal, and the PR is developed after the exposure process. For example, the PR may be a positive PR. As the exposed portion of the PR is removed through the developing process, a through hole may be formed, and the seed metal may be exposed through a bottom surface of the through hole. Thereafter, a conductive pillar 420 may be formed on the first substrate 100 through a plating process. After the conductive pillar is formed, the PR pattern is removed. The PR pattern may be removed through a strip/ashing process. After the PR pattern is removed, the seed metal may be exposed between the conductive pillars 420. Subsequently, the exposed seed metal is removed through an etching process. The top surface of the first substrate 100 may be exposed through removal of the seed metal. Moreover, the seed metal on the bottom surface of the conductive pillar 420 may be maintained unchanged.

Figure 10C:
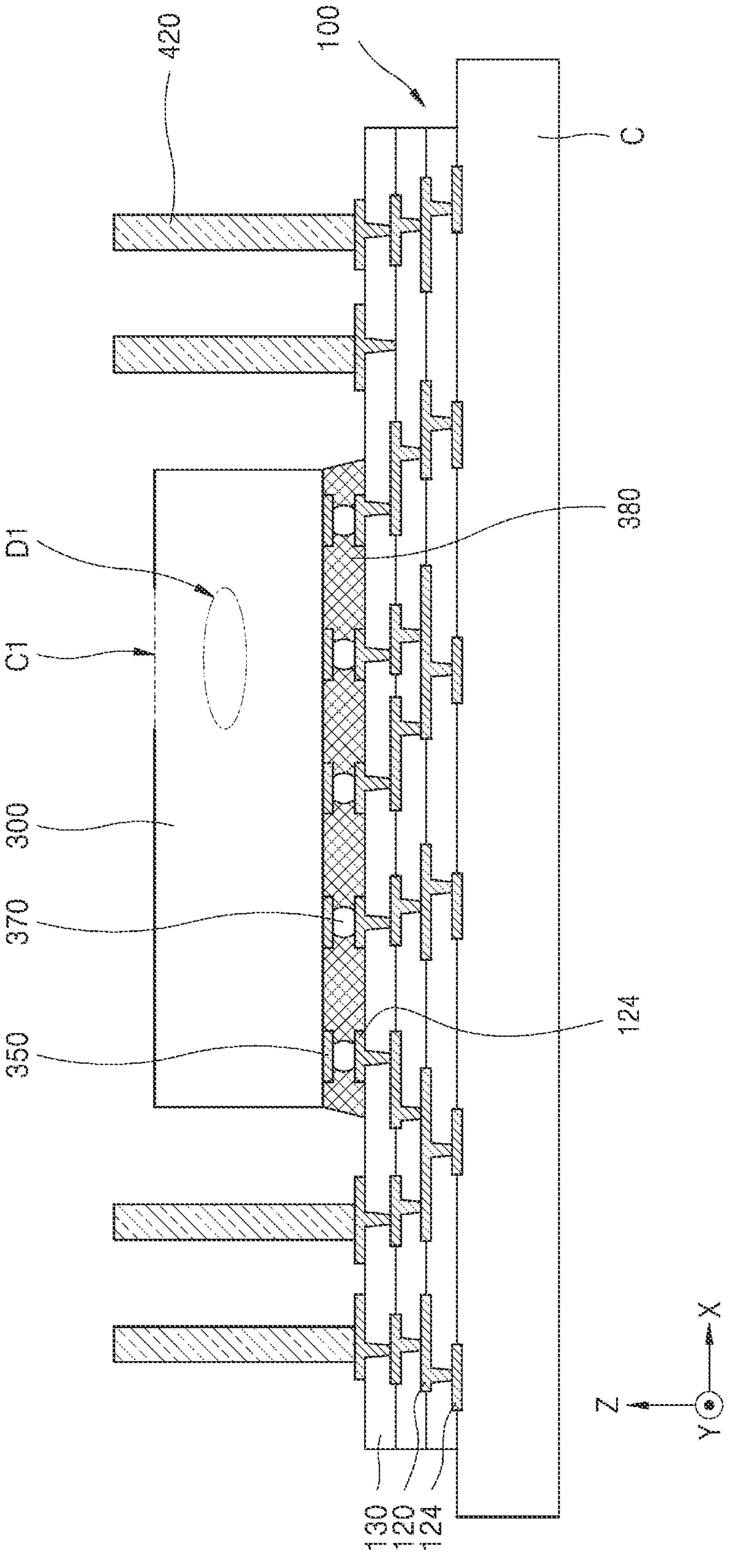

Referring to FIG. 10C, thereafter, the first semiconductor chip 300 is mounted on the central portion of the first substrate 100. The first semiconductor chip 300 may be mounted on the first substrate 100 in a flip-chip structure by using the first bump structure 370. In some embodiments, an underfill may be filled between the first bump structures 370 between the first substrate 100 and the first semiconductor chip 300.

Figure 10D:
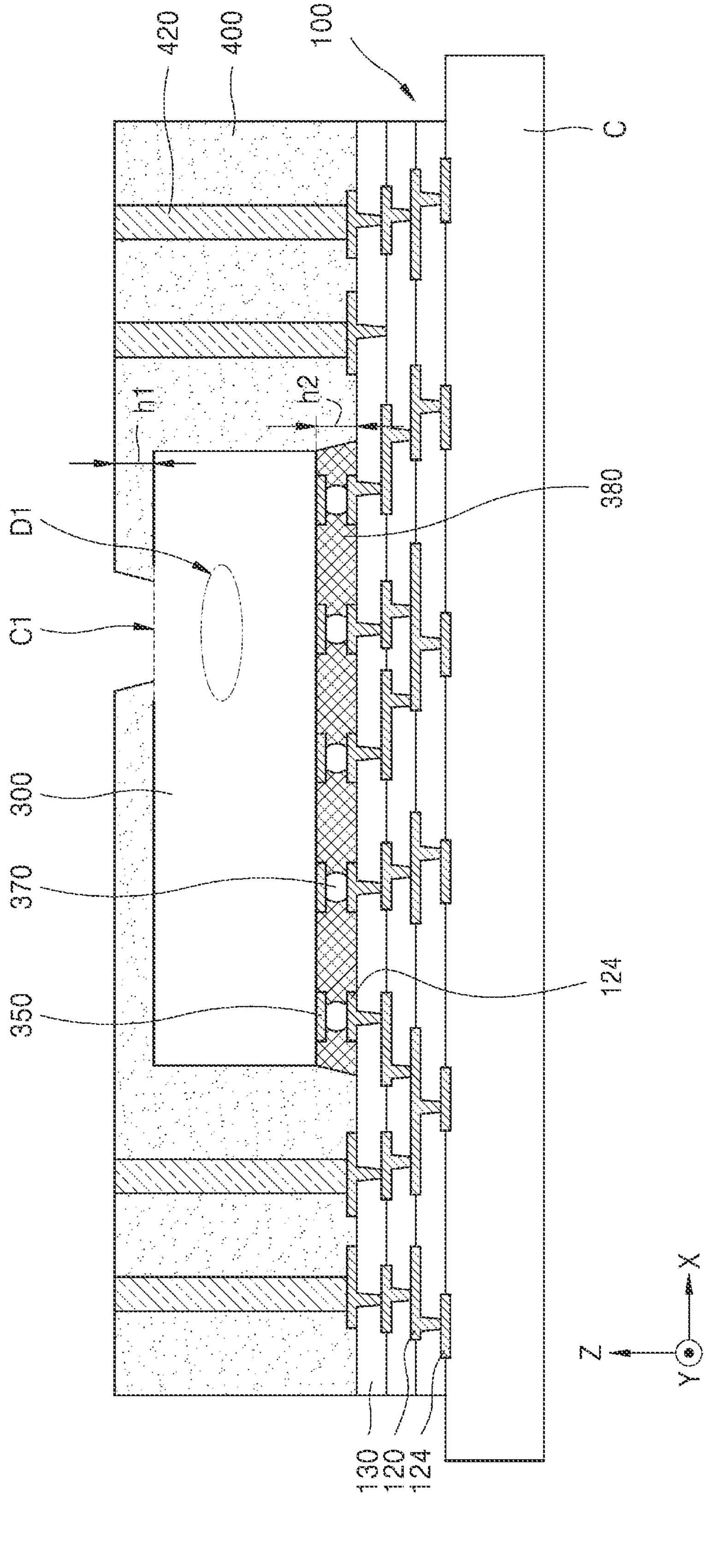

Referring to FIG. 10D, after the first semiconductor chip 300 is mounted, an encapsulant 400 covering the first semiconductor chip 300 and the conductive pillar 420 is formed on the first substrate 100. The encapsulant 400 may cover side surfaces and upper surfaces of the first semiconductor chip 300 and the conductive pillar 420. The material of the encapsulant 400 may be the same as that of the encapsulant 400 of the semiconductor package 10 of FIG. 1. Thereafter, a planarization process of removing the upper portion of the encapsulant 400 is performed. The planarization process may be performed, for example, through chemical-mechanical polishing (CMP).

Thereafter, a recess is formed from the top surface of the encapsulant 400 to the first contact region C1. The recess may be formed using at least one of laser drilling, machining, and etching.

Figure 10E:
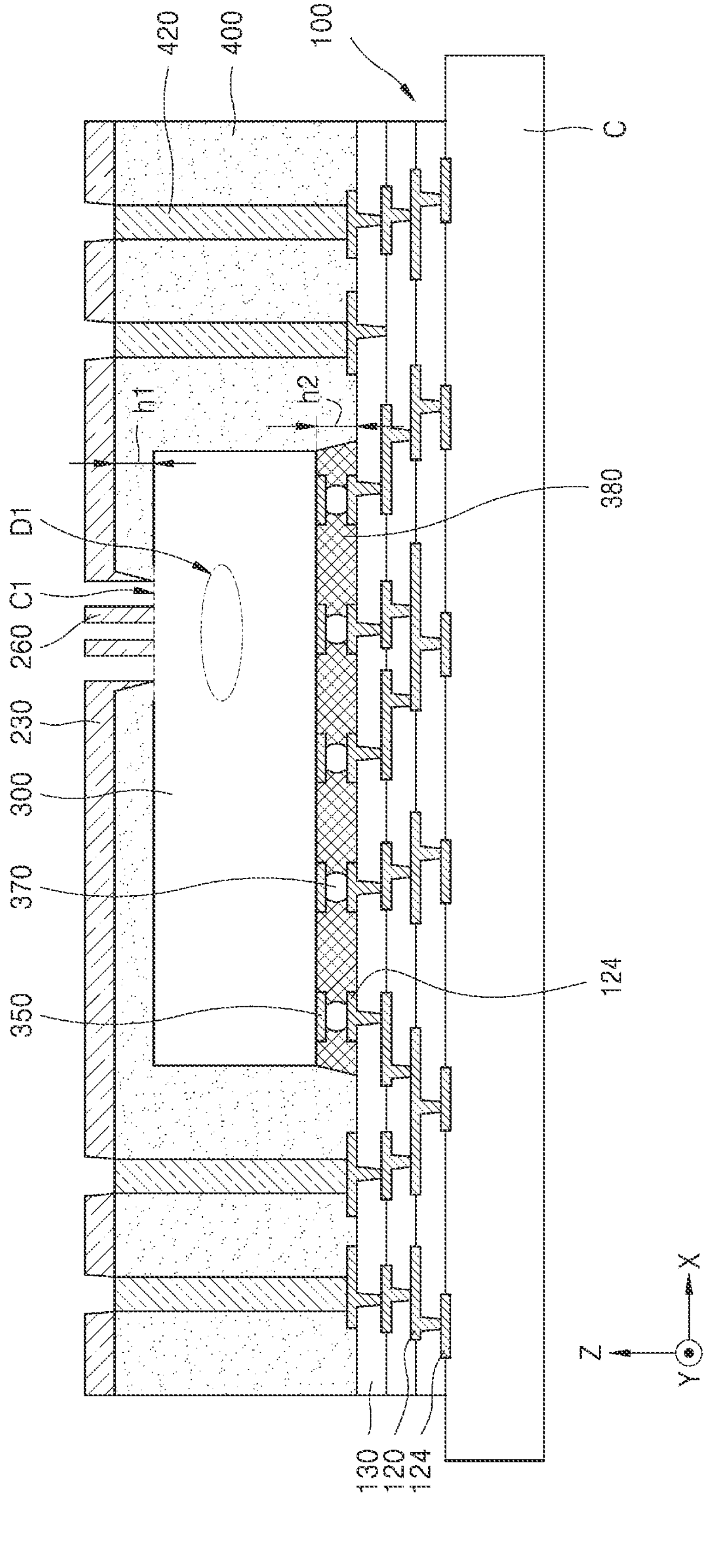

Referring to FIG. 10E, a first redistribution insulating layer 230 and a second redistribution insulating layer 260 are formed on the first semiconductor chip 300, the conductive pillar 420, and the encapsulant 400. In some embodiments, the first redistribution insulating layer 230 and the second redistribution insulating layer 260 may be formed by coating a photosensitive polyimide film on the top surface and the recess of the encapsulant 400.

Thereafter, a first opening exposing the conductive pillars 420 and a plurality of second openings exposing a portion of the first contact region C1 are formed.

Figure 10F:
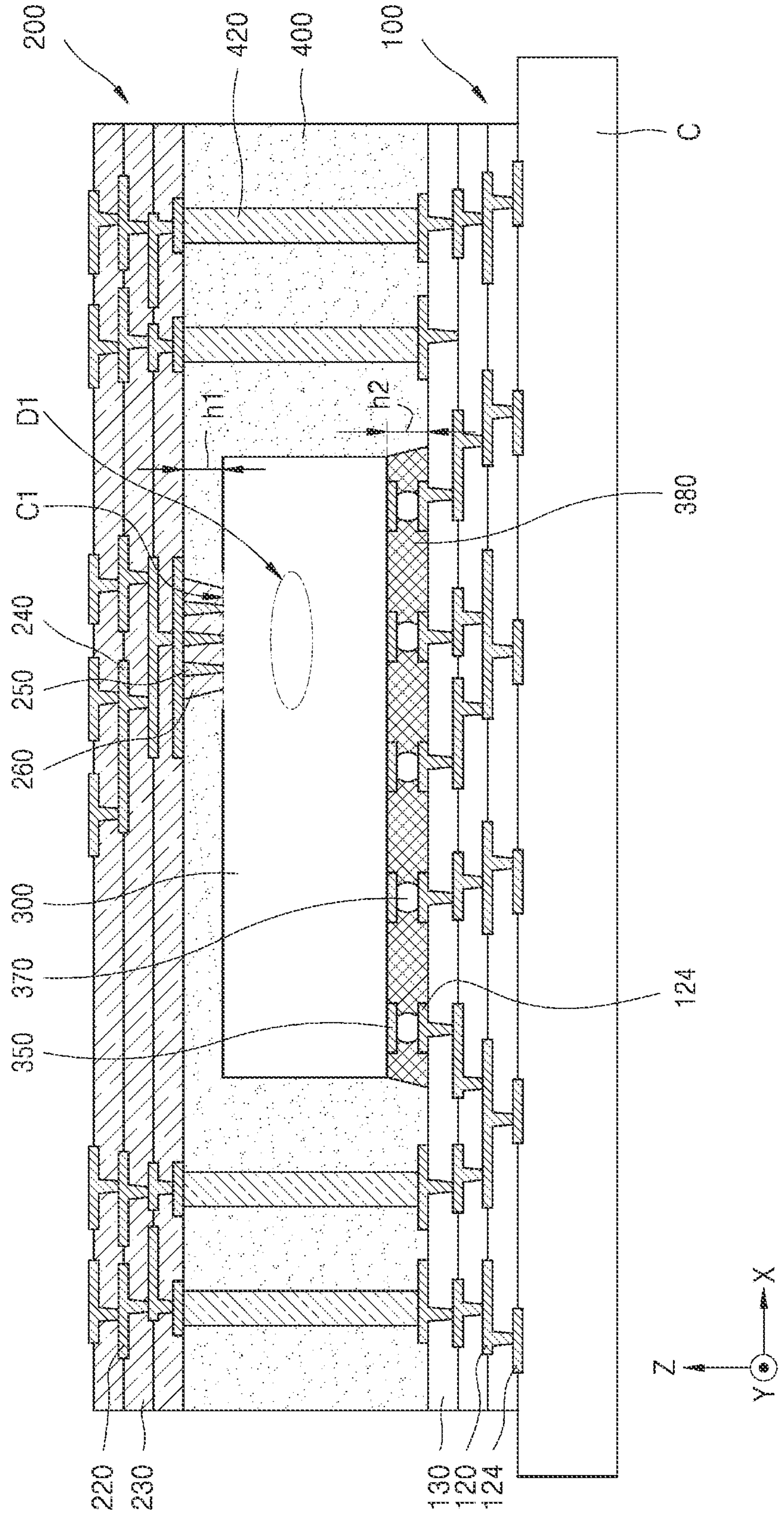

Referring to FIG. 10F, a lower pad 222 is filled in the first opening, and a heat-conducting through via 250 is filled in the second opening. Thereafter, the first redistribution insulating layer 230, the redistribution pattern 220, and the thermally conductive pattern 240 physically connected to the heat-conducting through via 250 are formed.

Figure 10G:
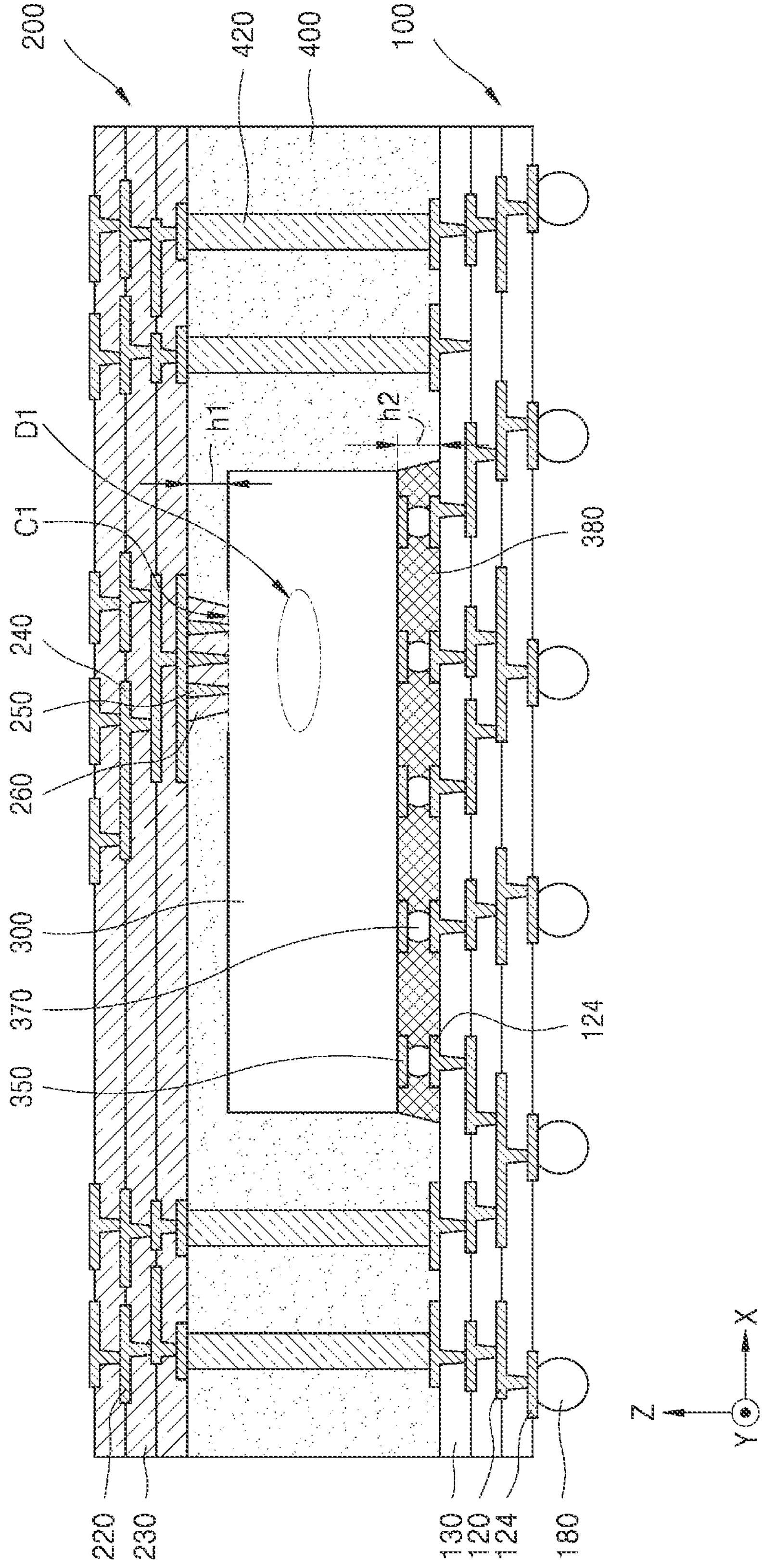

Referring to FIG. 10G, thereafter, the semiconductor package 10 of FIG. 1 may be completed by separating the carrier substrate C from the first substrate 100 and arranging the external connection terminal 180 on the bottom surface of the first substrate 100. Moreover, as described above, because the processes of FIGS. 10A to 10G are formed at the wafer level, the semiconductor package 10 of FIG. 1 may be substantially completed through the singulation process of separating the carrier substrate C into individual semiconductor packages.

While the inventive concept has been particularly shown and described with reference to embodiments thereof, it will be understood that various changes in form and details may be made therein without departing from the spirit and scope of the following claims.

What is claimed is:

1. A semiconductor package comprising:

a package substrate;

a first semiconductor chip including a semiconductor substrate having an active surface and an inactive surface opposite to the active surface, the first semiconductor chip disposed on the package substrate such that the active surface faces the package substrate;

an encapsulant surrounding the first semiconductor chip; and a first redistribution structure on the encapsulant, and including a thermally conductive pattern, a heat-conducting through via providing a path for heat to conduct from the semiconductor substrate to the thermally conductive pattern, and a redistribution insulating layer surrounding the heat-conducting through via, wherein the semiconductor substrate includes a first contact region, wherein the heat-conducting through via passes through the encapsulant and contacts the first contact region, and wherein the redistribution insulating layer is surrounded by the encapsulant and is composed of a material different from a material of the encapsulant.

2. The semiconductor package of claim 1, wherein the first semiconductor chip further includes a device layer formed on the active surface, and wherein the device layer includes a first dense region having a higher density of semiconductor devices than a density of semiconductor devices in a remainder of the device layer.

3. The semiconductor package of claim 2, wherein the first dense region overlaps the first contact region in a vertical direction.

4. The semiconductor package of claim 2, wherein the first dense region does not overlap the first contact region in a vertical direction.

5. The semiconductor package of claim 2, wherein the device layer further includes a second dense region, distinct from the first dense region, having a higher density of semiconductor devices than in the remainder of the device layer, wherein the semiconductor substrate further includes a second contact region that overlaps the second dense region in a vertical direction, and wherein the first redistribution structure further includes a second heat-conducting through via passing through the encapsulant and in contact with the second contact region.

6. The semiconductor package of claim 1, wherein a plurality of heat-conducting through vias are provided, and wherein the plurality of heat-conducting through vias are spaced apart from one another in a horizontal direction.

7. The semiconductor package of claim 1, wherein a vertical distance from a top surface of the first semiconductor chip to a bottom surface of the first redistribution structure is substantially equal to a vertical distance from a bottom surface of the first semiconductor chip to the top surface of the package substrate.

8. The semiconductor package of claim 1, wherein the package substrate includes a second redistribution structure.

9. The semiconductor package of claim 1, wherein the encapsulant includes a recess extending in a vertical direction from a top surface of the encapsulant to a surface in contact with the inactive surface of the semiconductor substrate, and wherein the redistribution insulating layer is in the recess.

10. The semiconductor package of claim 1, further comprising at least one second semiconductor chip mounted on a top surface of the first redistribution structure.

11. The semiconductor package of claim 1, wherein the first semiconductor chip is a logic semiconductor chip including logic devices.

12. A semiconductor package comprising:

a package substrate;

a semiconductor chip including a semiconductor substrate having an active surface and an inactive surface opposite to the active surface, the semiconductor chip being disposed on the package substrate such that the active surface faces the package substrate;

an encapsulant surrounding the semiconductor chip; and a first redistribution structure on the encapsulant, and including a first redistribution insulating layer, a thermally conductive pattern in the first redistribution insulating layer, and a heat-conducting through via providing a path for heat to conduct from the semiconductor substrate to the thermally conductive pattern, wherein the semiconductor substrate includes a first contact region, wherein the heat-conducting through via passes through the encapsulant and is in contact with the first contact region, wherein the encapsulant surrounds the heat-conducting through via, wherein the package substrate is electrically connected to the first redistribution structure through a conductive pillar extending in the encapsulant, the conductive pillar spaced laterally apart from the semiconductor chip, wherein the first redistribution structure further comprises a redistribution pattern in the first redistribution insulating layer, wherein the redistribution pattern is configured to provide an electrical path from a bottom surface of the first redistribution structure to a top surface of the first redistribution structure, for an electrical connection from the conductive pillar, and wherein the thermally conductive pattern is configured to provide a thermal path for heat transfer from the bottom surface of the first redistribution structure to the top surface of the first redistribution structure, for heat from the heat-conducting through via.

13. The semiconductor package of claim 12, wherein the encapsulant includes a plurality of holes extending from a top surface of the encapsulant to the first contact region.

14. The semiconductor package of claim 12, wherein the semiconductor chip further includes a device layer formed on the active surface, and wherein the device layer includes a first dense region having a higher density of semiconductor devices than a density of semiconductor devices in a remainder of the device layer.

15. The semiconductor package of claim 14, wherein the first dense region overlaps the first contact region in a vertical direction.

16. The semiconductor package of claim 14, wherein the device layer further includes a second dense region having a higher device density other than the first dense region, wherein the semiconductor substrate further includes a second contact region which has a higher temperature than a surrounding area in a region other than the first contact region, and wherein the first redistribution structure further includes another heat-conducting through via passing through the encapsulant and being in contact with the second contact region.

17. The semiconductor package of claim 12, wherein the package substrate includes a second redistribution structure.

18. A semiconductor package comprising:

a first redistribution structure;

a semiconductor chip including a semiconductor substrate having an active surface and an inactive surface opposite to the active surface, and a device layer formed on the active surface and having a plurality of semiconductor devices formed thereon, the semiconductor chip mounted on the first redistribution structure such that the device layer faces the first redistribution structure;

an encapsulant surrounding the semiconductor chip; and a second redistribution structure on the encapsulant and including a thermally conductive pattern and a plurality of heat-conducting through vias providing a path for heat to conduct from the semiconductor substrate to the thermally conductive pattern, wherein the semiconductor substrate includes a first contact region on the inactive surface, wherein the plurality of heat-conducting through vias pass through the encapsulant and contact with a lower pad formed in the second redistribution structure, wherein the first redistribution structure is electrically connected to the second redistribution structure through a conductive pillar extending in the encapsulant, the conductive pillar spaced laterally apart from the semiconductor chip, wherein the second redistribution structure further comprises a redistribution pattern, wherein the redistribution pattern is configured to provide an electrical path from a bottom surface of the second redistribution structure to a top surface of the second redistribution structure, for an electrical connection from the conductive pillar, and wherein the thermally conductive pattern is configured to provide a thermal path for heat transfer from the bottom surface of the second redistribution structure to the top surface of the second redistribution structure, for heat from the plurality of heat-conducting through vias.

19. The semiconductor package of claim 18, comprising a redistribution insulating layer surrounding the plurality of heat-conducting through vias, and wherein the encapsulant includes a recess extending in a vertical direction from a top surface of the encapsulant to a surface in contact with the inactive surface of the semiconductor substrate, wherein the redistribution insulating layer is in the recess, and wherein the redistribution insulating layer is composed of a material different from a material of the encapsulant.

20. The semiconductor package of claim 18, comprising another plurality of heat-conducting through vias passing through the encapsulant and being in contact with the lower pad.

* * * * *